United States Patent
Zhuo et al.

(10) Patent No.: US 8,045,944 B2
(45) Date of Patent: Oct. 25, 2011

(54) OFFSET CORRECTION FOR PASSIVE MIXERS

(75) Inventors: Wei Zhuo, San Diego, CA (US); Roger Brockenbrough, Los Gatos, CA (US); Solti Peng, Plano, TX (US)

(73) Assignee: QUALCOMM Incorporated, San Diego, CA (US)

( * ) Notice: Subject to any disclaimer, the term of this patent is extended or adjusted under 35 U.S.C. 154(b) by 640 days.

(21) Appl. No.: 11/864,310

(22) Filed: Sep. 28, 2007

(65) Prior Publication Data
US 2009/0075622 A1 Mar. 19, 2009

Related U.S. Application Data

(60) Provisional application No. 60/972,719, filed on Sep. 14, 2007.

(51) Int. Cl.
*H04B 1/10* (2006.01)
*G05F 1/10* (2006.01)

(52) U.S. Cl. ..... 455/296; 455/326; 455/333; 455/226.1; 327/538; 327/541

(58) Field of Classification Search ................. 455/295, 455/296, 311, 317, 326, 333; 327/356, 359, 327/538, 541
See application file for complete search history.

(56) References Cited

U.S. PATENT DOCUMENTS

| | | | | |
|---|---|---|---|---|
| 5,448,197 | A * | 9/1995 | Sagawa et al. | 327/408 |
| 5,726,597 | A * | 3/1998 | Petty et al. | 327/307 |
| 6,255,889 | B1 * | 7/2001 | Branson | 327/359 |
| 6,343,211 | B1 * | 1/2002 | Thodesen et al. | 455/317 |
| 6,433,647 | B1 | 8/2002 | Filoramo et al. | |
| 6,639,446 | B2 * | 10/2003 | Komurasaki et al. | 327/355 |
| 6,665,528 | B2 * | 12/2003 | McNamara et al. | 455/326 |
| 6,871,057 | B2 * | 3/2005 | Ugajin et al. | 455/323 |
| 7,102,411 | B2 * | 9/2006 | Behzad | 327/359 |
| 7,554,380 | B2 * | 6/2009 | Embabi et al. | 327/356 |
| 7,676,213 | B2 * | 3/2010 | Taylor et al. | 455/333 |
| 2002/0113650 | A1 | 8/2002 | Kim et al. | |
| 2002/0160738 | A1 * | 10/2002 | Allott et al. | 455/304 |
| 2003/0169089 | A1 | 9/2003 | Manku et al. | |
| 2007/0111694 | A1 | 5/2007 | Lin | |

FOREIGN PATENT DOCUMENTS

| CA | 2375438 | 9/2003 |
|---|---|---|
| KR | 20020067331 A | 8/2002 |

OTHER PUBLICATIONS

International Search Report and Written Opinion—PCT/US2008/076087, International Search Authority—European Patent Office—Mar. 6, 2009.

(Continued)

*Primary Examiner* — Duc M Nguyen
(74) *Attorney, Agent, or Firm* — Larry J. Moskowitz

(57) ABSTRACT

A downconversion mixer includes a configurable gate or bulk bias voltage to allow calibration and correction of device offsets. Calibration may be performed on the configurable bias voltages to minimize IM2 distortion in the mixer. The techniques have minimal impact on voltage headroom, impose no requirement for a signal path to be phase-matched with a calibration path, and are particularly well-suited for passive mixers.

48 Claims, 10 Drawing Sheets

OTHER PUBLICATIONS

Kim B et al: "CMOS RF Amplifier and Mixer Circuits Utilizing Complementary Characteristics of Parallel Combined NMOS and PMOS Devices" IEEE Transactions on Microwave Theory and Techniques, IEEE Service Center, Piscataway, NJ, US, vol. 53, No. 5, May 1, 2005, pp. 1662-1671, XP011131609 ISSN: 0018-9480 p. 1666, col. 2, line 32-p. 1669, col. 2, line 23; figure 14.

Woonyun Kim et al: "IP2 calibrator using common mode feedback circuitry" Solid-State Circuits Conference, 2005. ESSCIRC 2005. Proceedings of the 31st European, IEEE, Piscataway, NJ, USA, Sep. 12, 2005, pp. 231-234, XP010854945 ISBN: 978-0-7803-9205-2 p. 232, col. 1, line 10-p. 233, col. 1, line 22; figures 2,5.

Translation of Office Action in Korean application 10-2010-7008072 corresponding to U.S. Appl. No. 11/864,310, citing US20070132500 and KR20020067331 dated Apr. 29, 2011.

* cited by examiner

OFFSET CORRECTION FOR PASSIVE MIXERS

RELATED APPLICATIONS

This application claims benefit of U.S. Provisional Application No. 60/972,719 titled "OFFSET CORRECTION FOR PASSIVE MIXERS," filed Sep. 14, 2007, the entire disclosure of this application being considered part of the disclosure of this application.

TECHNICAL FIELD

The disclosure relates to communications receivers and, more particularly, to offset correction techniques for mixers in communications receivers.

BACKGROUND

In a digital communication system, a receiver receives a radio-frequency (RF) modulated signal from a transmitter. The receiver downconverts the received signal from RF to baseband, digitizes the baseband signal to generate samples, and digitally processes the samples to recover data sent by the transmitter. The receiver may use one or more downconversion mixers to downconvert the received signal from RF to baseband.

An ideal mixer simply translates an input signal from one frequency to another without distortion. In integrated circuits, however, the mixer's performance may deviate from the ideal case due to mismatch between the transistors caused by, e.g., layout or process variations. Such mismatch may introduce distortion into the output of the mixer, leading to unwanted inter-modulation products. For example, in a mixer for a direct conversion receiver, second-order inter-modulation (IM2) products in particular may especially degrade the signal-to-noise ratio (SNR) at baseband. While symmetrical layout and differential signal processing can help reduce the effects of device mismatch, there may still be residual mismatch due to process limitations.

Disclosed herein are techniques to provide for configurable parameters in a mixer to calibrate and correct for such mismatch, thereby minimizing mixer distortion.

SUMMARY

An aspect of the present disclosure provides a receiver apparatus comprising a mixer operative to mix an input radio frequency (RF) signal with a local oscillator (LO) signal to generate a baseband signal, the mixer comprising first and second RF transistors to receive the input RF signal, the mixer further comprising first and second LO transistors to receive the LO signal, at least one of the transistors having a gate bias voltage that is variable in response to a configurable control signal.

Another aspect of the disclosure provides a receiver apparatus comprising: a mixer operative to mix an input radio frequency (RF) signal with a local oscillator (LO) signal to generate a baseband signal, the mixer comprising first and second RF transistors to receive the input RF signal, the mixer further comprising first and second LO transistors to receive the LO signal, at least one of the transistors having a bulk bias voltage that is variable in response to a configurable control signal.

Yet another aspect of the disclosure provides a method for downconverting a received signal, the method comprising providing a configurable control signal to a mixer, the control signal specifying a gate bias voltage of at least one transistor in said mixer; and downconverting said received signal by mixing said received signal with a local oscillator signal.

Yet another aspect of the disclosure provides a method for downconverting a received signal, the method comprising providing a configurable control signal to a mixer, the control signal specifying a bulk bias voltage of at least one transistor in said mixer; and downconverting said received signal by mixing said received signal with a local oscillator signal.

Yet another aspect of the disclosure provides a method for calibrating a mixer, the method comprising providing a signal input to the mixer; initializing at least one gate bias voltage of the mixer, and measuring an output characteristic of the mixer associated with the at least one initialized gate bias voltage; adjusting the at least one gate bias voltage of the mixer, and measuring the output characteristic of the mixer associated with the at least one adjusted gate bias voltage; based on the measured output characteristic of the mixer, determining a preferred setting for the at least one gate bias voltage of the mixer; and storing said preferred setting for use during operation of the mixer.

Yet another aspect of the disclosure provides a method for calibrating first and second mixers in a receiver, the method comprising providing a signal input to the receiver; initializing at least one gate bias voltage of the first mixer, and measuring an output characteristic of the first mixer associated with the at least one initialized gate bias voltage; adjusting the at least one gate bias voltage of the first mixer, and measuring the output characteristic of the first mixer associated with the at least one adjusted gate bias voltage; based on the measured output characteristic of the first mixer, determining a preferred setting for the at least one gate bias voltage of the first mixer; and while setting the at least one gate bias voltage of the first mixer to the preferred setting, repeating the steps of adjusting, measuring and determining for the second mixer.

Yet another aspect of the disclosure provides a method for calibrating a mixer, the method comprising providing a signal input to the mixer; initializing at least one bulk bias voltage of the mixer, and measuring an output characteristic of the mixer associated with the at least one initialized bulk bias voltage; adjusting the at least one bulk bias voltage of the mixer, and measuring the output characteristic of the mixer associated with the at least one adjusted bulk bias voltage; based on the measured output characteristic of the mixer, determining a preferred setting for the at least one bulk bias voltage of the mixer; and storing said preferred setting for use during operation of the mixer.

Yet another aspect of the disclosure provides a method for calibrating first and second mixers in a receiver, the method comprising providing a signal input to the receiver; initializing at least one bulk bias voltage of the first mixer, and measuring an output characteristic of the first mixer associated with the at least one initialized bulk bias voltage; adjusting the at least one bulk bias voltage of the first mixer, and measuring the output characteristic of the first mixer associated with the at least one adjusted bulk bias voltage; based on the measured output characteristic of the first mixer, determining a preferred setting for the at least one bulk bias voltage of the first mixer; and while setting the at least one bulk bias voltage of the first mixer to the preferred setting, repeating the steps of adjusting, measuring and determining for the second mixer.

DETAILED DESCRIPTION

In accordance with the present disclosure, techniques are disclosed for calibrating and correcting offset in mixer devices.

Figure 1:
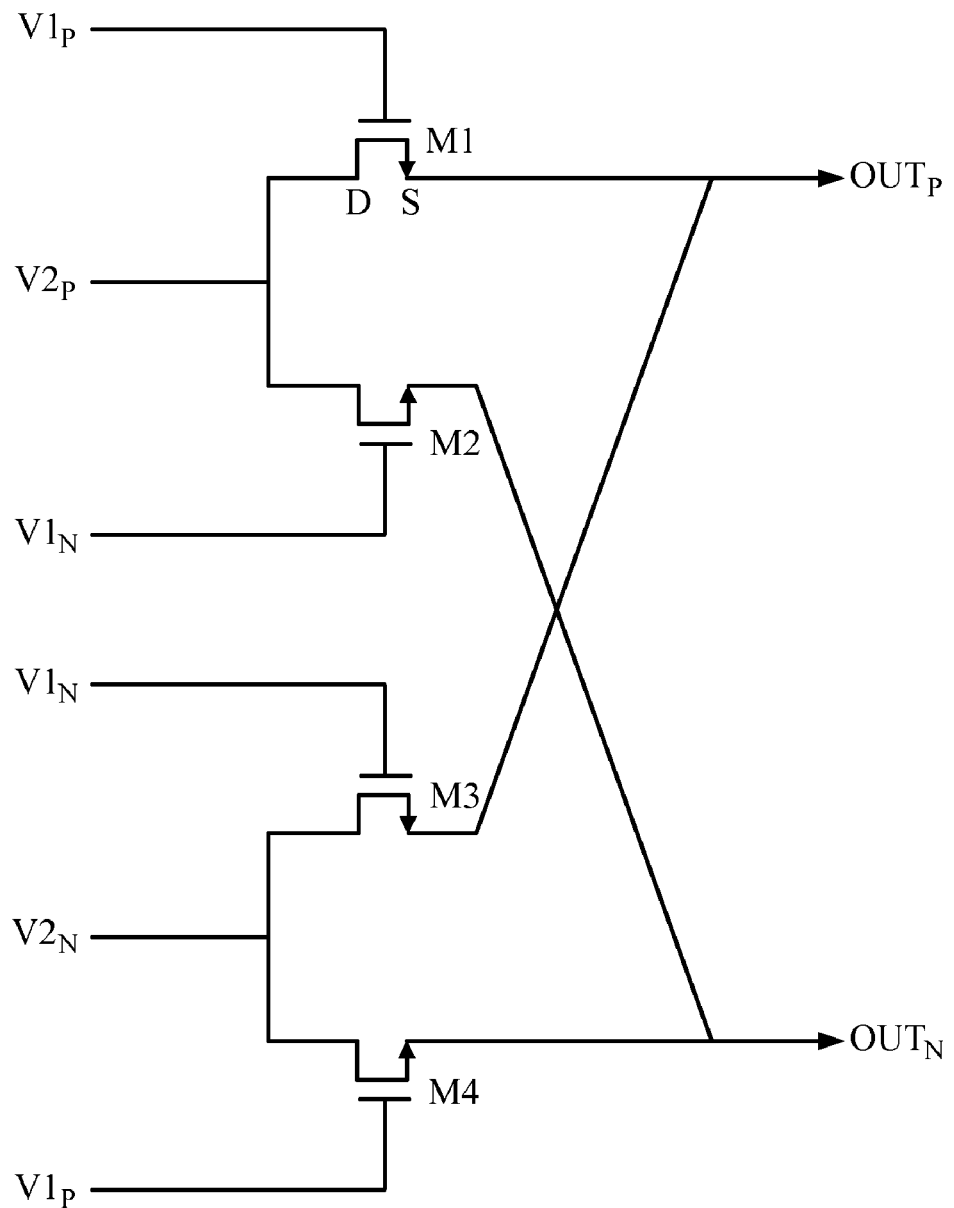
FIG. 1 shows a conventional circuit topology for a passive mixer.

FIG. 1 shows a conventional circuit topology for a passive mixer. Note FIG. 1 does not show the details of DC biasing and coupling. In FIG. 1, a first differential voltage V1 ($V1=V1_P-V1_N$) is mixed with a second differential voltage V2 ($V2=V2_P-V2_N$) to produce a differential current output IOUT ($IOUT=IOUT_P-IOUT_N$, wherein $IOUT_P$ is defined as the current flowing out of terminal $OUT_P$, and $IOUT_N$ is the current flowing into terminal $OUT_N$). Assuming the transistors are matched, the output current may be approximated as:

$$IOUT = \frac{V2}{r_{ds}} \approx V2 \cdot \mu C_{OX} \frac{W}{L}[(V1 - V_T) - V2] \approx K \cdot V1 \cdot V2 \quad \text{Eq (1)}$$

where $r_{ds}$ is the resistance between the drain (D) and source (S) (representatively labeled for transistor M1 in FIG. 1), $\mu C_{OX}$ represents the transistor device parameter, W and L represent the width and length of each transistor, $V_T$ represents the threshold voltage, and K represents a constant term. See, e.g., Thomas H. Lee, "The Design of CMOS Radio-Frequency Integrated Circuits," (1998), page 341.

In actual integrated circuits, device mismatch may introduce non-linear distortion into the output of the mixer, causing deviation of the mixer's input-output characteristics from the ideal scenario of Eq (1). To address the effects of mismatch, one or more bias voltages of transistors M1-M4 may be adjusted according to the present disclosure.

Figure 2:
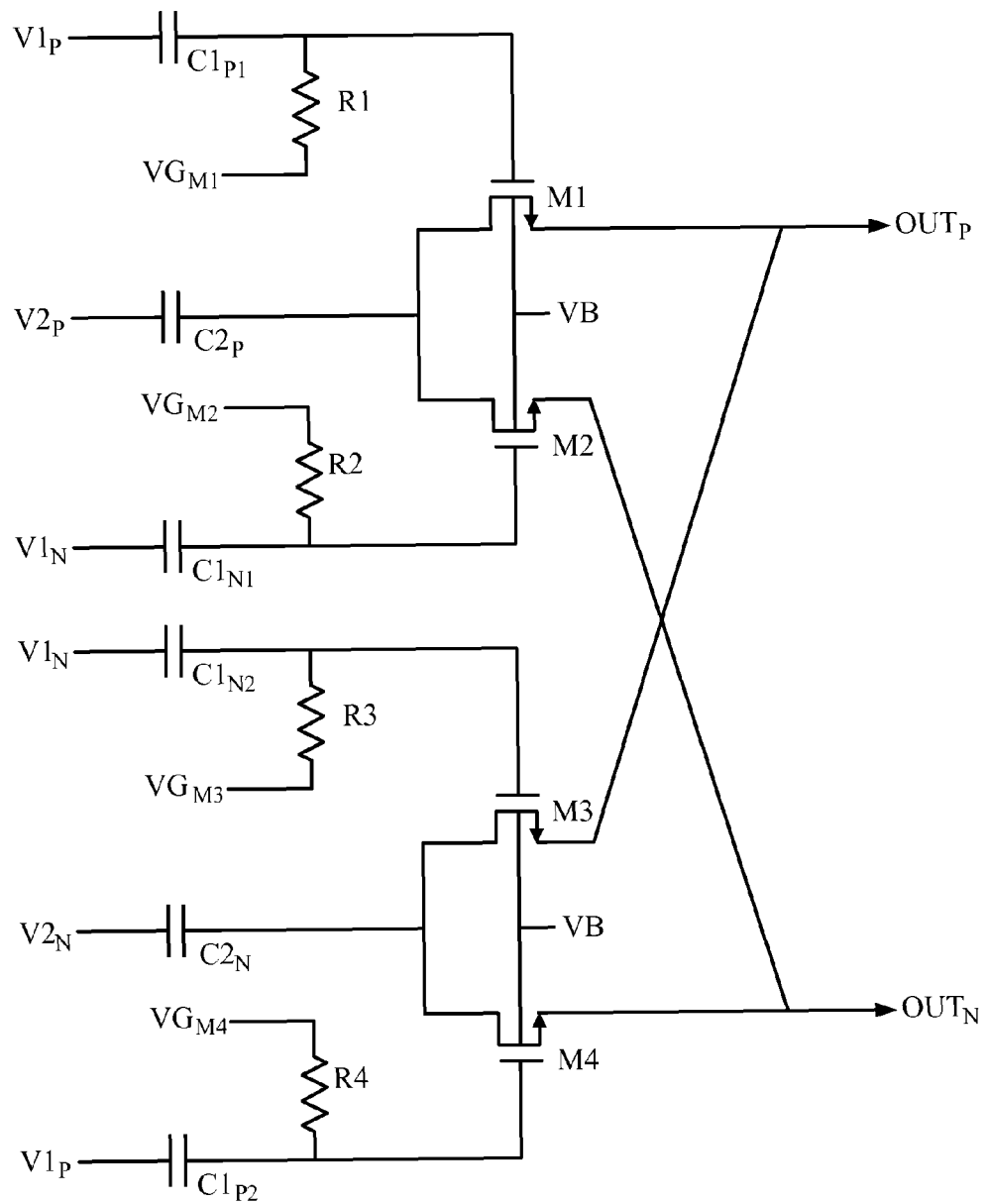
FIG. 2 depicts an embodiment wherein the DC gate bias voltages of the transistors are made configurable to correct for mismatch in transistors M1-M4 of the mixer.

FIG. 2 depicts an embodiment wherein the DC gate bias voltages of the transistors are made configurable to correct for mismatch in transistors M1-M4 of the mixer. Voltages $VG_{M1}$, $VG_{M2}$, $VG_{M3}$, and $VG_{M4}$ represent the gate bias voltages of each of transistors M1-M4, respectively. The bias voltages may be coupled to the transistor gates by resistors R1-R4, which may nominally have the same resistances. By introducing intentional offsets in the gate bias voltages, mismatch between transistors M1-M4 as well as resistors R1-R4 can be corrected. In FIG. 2, capacitors $C1_{P1}$, $C1_{N1}$, $C1_{P2}$, $C1_{N2}$, $C2_P$, and $C2_N$ serve to couple only the AC components of the signals V1 and V2 to the mixer.

Note that FIG. 2 shows the bulk bias voltage VB to be constant for all transistors. However, the bulk bias voltages may also be made configurable in alternative embodiments described later herein.

In an embodiment, the bias voltages $VG_{M1}$, $VG_{M2}$, $VG_{M3}$, and $VG_{M4}$ may be directly set by externally supplied control signals VC1-VC4 as follows:

$VG_{M1}=VC1$, $VG_{M2}=VC2$, $VG_{M3}=VC3$, and $VG_{M4}=VC4$. \hfill Equations (2)

Thus VC1-VC4 allow for four degrees of freedom in configuring the four gate bias voltages.

In alternative embodiments, to simplify calibration, the degrees of freedom may be reduced by making some of the bias voltages non-configurable. In an embodiment, $VG_{M1}$ and $VG_{M3}$ can be made non-configurable, e.g., tied to on-chip voltage references, while $VG_{M2}$ and $VG_{M4}$ can be made independently configurable by control signals VC1 and VC2. While this decreases the degrees of freedom in the configuration to two, it also allows for simpler calibration due to the fewer number of parameters.

In another embodiment, the gate bias voltages may be specified as follows:

$VG_{M2}=VG_{M1}+VC1$, and $VG_{M4}=VG_{M3}+VC2$; \hfill Equations (3)

where $VG_{M1}$ and $VG_{M3}$ are non-configurable, and VC1 and VC2 can be characterized as the configurable bias offset voltages between the transistors in each differential pair.

In yet another embodiment, two out of the four gate bias voltages may be specified as follows:

$VG_{M1}=VG_{M1\_nom}+VC1$, and $VG_{M3}=VG_{M3\_nom}+VC2$; \hfill Equations (4)

where $VG_{M1\_nom}$ and $VG_{M3\_nom}$ represent nominal values for $VG_{M1}$ and $VG_{M3}$, respectively. The remaining gate bias voltages $VG_{M2}$ and $VG_{M4}$ may be made non-configurable and set at nominal voltages.

In yet another embodiment, to simplify calibration even further, only one of the four gate bias voltages need be made configurable.

In general, the bias voltages may be specified by the control signal or signals directly as in Equations (2), or indirectly by any linear or non-linear relationship, such as the relationships shown in Equations (3) and (4).

Figure 3:
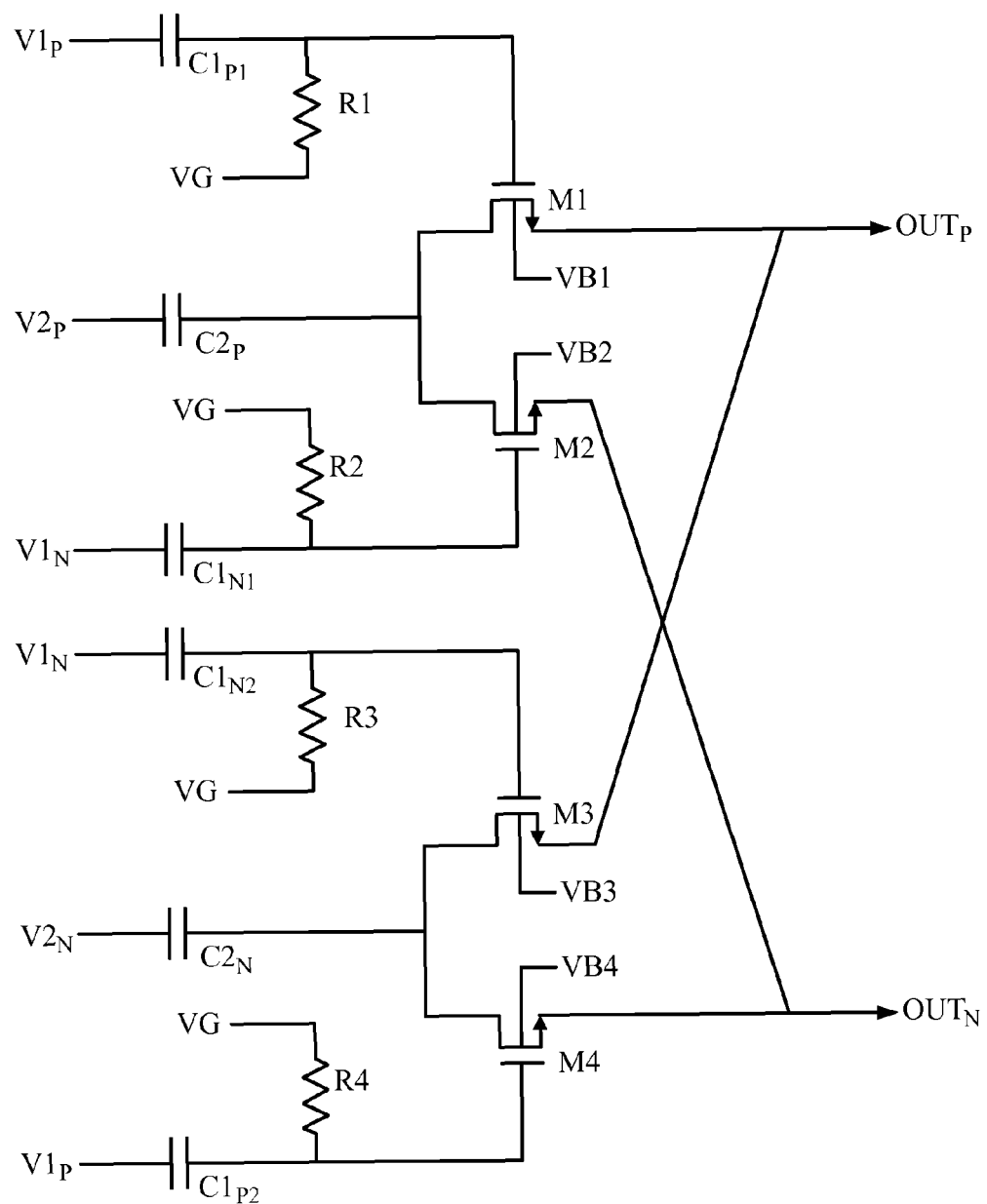
FIG. 3 depicts a further embodiment wherein the bulk bias voltages, rather than the gate bias voltages, of the transistors are made configurable to correct for mismatch in transistors M1-M4 of a mixer.

FIG. 3 depicts a further embodiment wherein the bulk, rather than the gate, bias voltages of the transistors are made configurable to correct for mismatch in transistors M1-M4 of a mixer. Voltages $VB_{M1}$, $VB_{M2}$, $VB_{M3}$, and $VB_{M4}$ represent the bulk bias voltages of each of transistors M1-M4, respectively. By introducing intentional offsets in the bulk bias voltages, mismatch between transistors M1-M4 can be corrected. Note that FIG. 3 shows the gate bias voltage VG to be non-configurable for all transistors. However, the gate bias voltages may also be made configurable according to the embodiments previously described herein.

Similar to the description for the gate bias voltages, control signals VC1-VC4 may be used to control the bulk bias voltages in four degrees of freedom. The bulk bias voltages may also be configurable in fewer than four degrees of freedom to simplify calibration, as previously described for the gate bias voltages. The control signals may be related to the bulk bias voltages directly or indirectly by any predetermined transformation.

Figure 4:
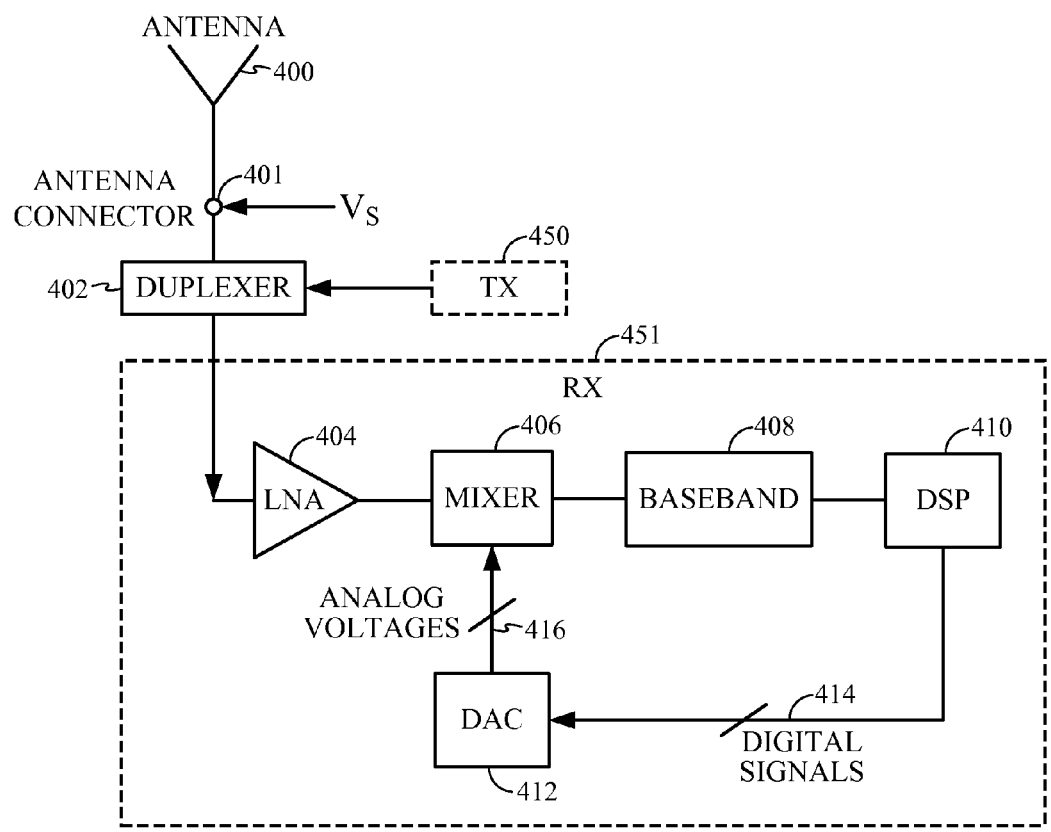
FIG. 4 depicts a calibration mechanism for a receiver utilizing a mixer with configurable bias voltages as described herein.

FIG. 4 depicts a calibration mechanism for a receiver utilizing a mixer with configurable bias voltages as described herein. During normal operation, an antenna 400 is connected to a duplexer 402 via an antenna connector 401. The duplexer 402 allows the antenna 400 to be shared between a transmit path (TX) 450 and a receive path (RX) 451. During a calibration phase, the antenna connector 401 can be supplied with a signal Vs. In an embodiment, the antenna 400 is disconnected from the antenna connector 401 when Vs is supplied to the antenna connector 401. In another embodiment (not shown), Vs can be supplied directly to the antenna 400 while connected to the antenna connector 401, e.g., in the form of electromagnetic radiation. The signal Vs is input to a low-noise amplifier (LNA) 404. In yet another embodiment (not shown), Vs can be supplied from the TX 450.

The output of the LNA is input to a mixer 406, which may support the configurable gate or bulk bias voltages previously described. The mixer 406 mixes the LNA output with a local oscillator LO (not shown) to generate a mixed signal. In an embodiment, the LO output corresponds to the differential signal V1 in FIG. 2 or 3, and the LNA output corresponds to the differential signal V2. In another embodiment, the LO output and LNA output may be reversed. The output of the mixer 406 is provided to a baseband processor 408. An output from the baseband processor 408 is supplied to a digital signal processor (DSP) 410.

Based on the output of the baseband processor 408, the DSP 410 outputs digital signals 414. In an embodiment, the digital signals 414 may comprise digital representations of the control signals VC1-VC4, or any subset of the control signals previously described herein. The digital signals 414 may be derived according to a calibration method to minimize IM2 products, to be described later herein, or the signals 414 may be derived according to any other method for any other purpose, e.g., minimizing other non-IM2 distortion. The digital signals 414 may be converted to analog voltages 416 by the digital-to-analog converter (DAC) 412. The analog voltages 416 may be used to configure the bias voltages of the mixer 406 as described previously herein.

The ranges over which control signals VC1 and VC2 are adjusted may be determined according to the mapping between the control signals and the specific bias voltage or voltages to be configured. In an embodiment, VC1 and VC2 adjust the offset between the gate bias voltages of the transistors in a differential pair, e.g., according to Equations (3). VC1 may then be configured to range from a minimum of $-V_{max\_offset}$ to a maximum of $+V_{max\_offset}$, where $V_{max\_offset}$ is a parameter related to the full scale range of VC1. VC2 can have a range identical to or different from that of VC1.

To specify a range that goes from a negative voltage offset to a positive voltage offset, the DAC 412 may support signed digital representations of the control signals. In an embodiment, VC1 can be represented by an eight-bit value programmed by the DSP 410 into an eight-bit register in the DAC 412. In an embodiment, bits <7:6> of the register can be a code indicating the $V_{max\_offset}$ used to determine the full scale range of VC1, and bits <5:0> can specify the signed magnitude of the control signal VC1, with bit <5> being the sign bit. In an embodiment, the mapping of bits <7:6> to $V_{max\_offset}$ can be as follows:

TABLE I

| Bits <7:6> | $V_{max\_offset}$ [mV] |
|---|---|
| 00 | 37 |
| 01 | 19 |
| 10 | 10 |
| 11 | 62 |

Other digital control signals, e.g., VC2-VC4 (if available), may be similarly represented if available.

Note the mechanism shown in FIG. 4 is meant to illustrate only one embodiment of a calibration mechanism for the configurable mixers disclosed herein. Alternative embodiments may employ fewer or more functional blocks than shown in FIG. 4. In an embodiment, the digital signals 414 may be generated and supplied directly by the baseband processor 408. In an alternative embodiment, they may be generated and supplied by modules not shown, e.g., by a microprocessor.

Note that the DAC 412 depicted in FIG. 4 may support any number of digital control inputs 414, and output one or more analog voltages 416 associated with each digital control input.

Figure 5:
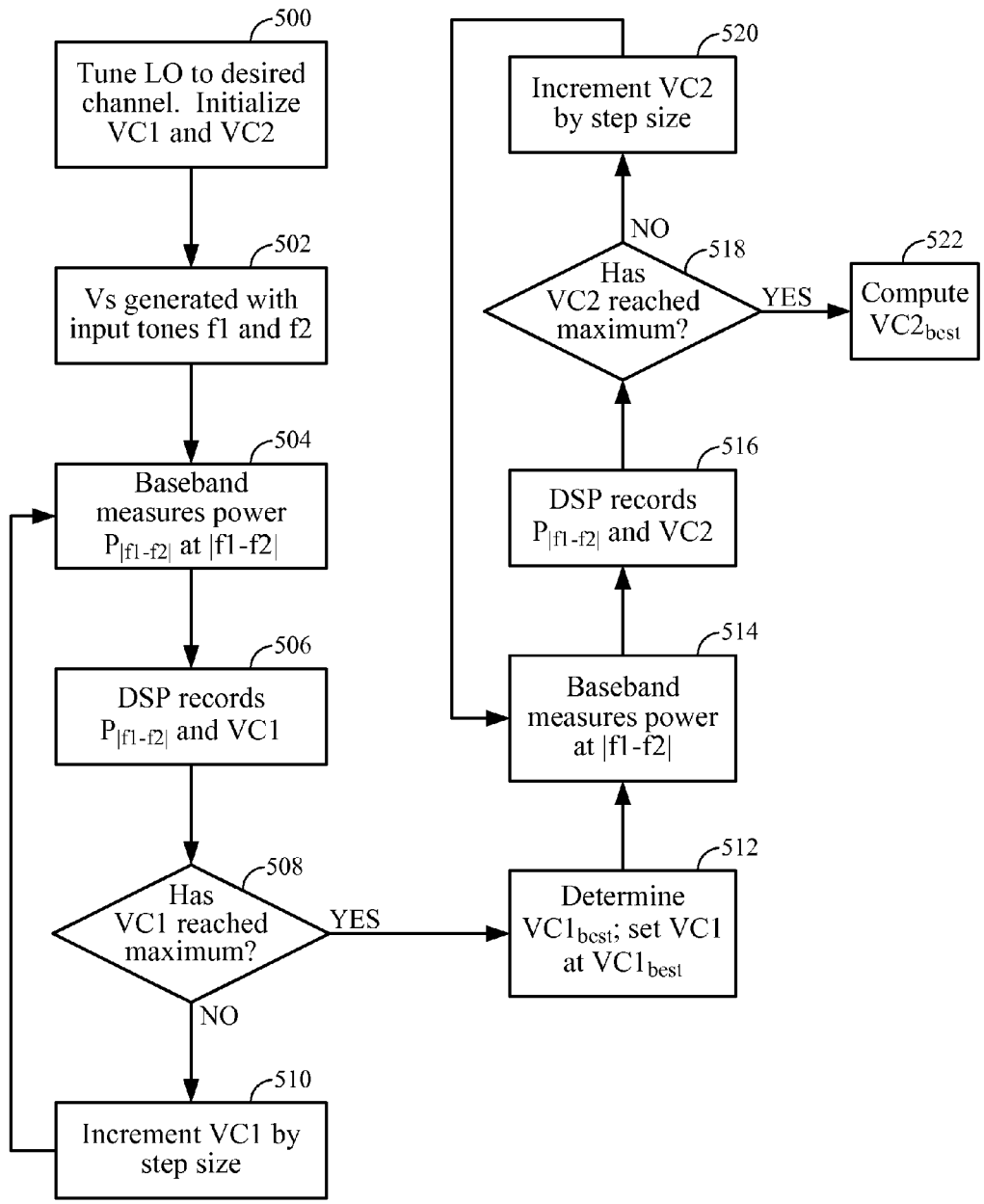
FIG. 5 depicts an embodiment of a method for calibrating a configurable mixer of the present disclosure to minimize second-order inter-modulation (IM2) products.

FIG. 5 depicts an embodiment of a method for calibrating a configurable mixer of the present disclosure to minimize second-order inter-modulation (IM2) products. The steps in FIG. 5 are described with reference to the calibration mechanism shown in FIG. 4. However, the method of FIG. 5 is equally applicable to calibration mechanisms other than the one shown in FIG. 4. For example, the method of FIG. 5 does not necessarily require an antenna 400 or elements other than the mixer 406 in the underlying calibration mechanism. For example, the method of FIG. 5 may utilize a microprocessor or other computing device in place of the DSP.

In the method of FIG. 5, the mixer is configurable in two degrees of freedom via control signals VC1 and VC2. However, the method can readily be extended to calibrate the mixer with fewer or more degrees of freedom in accordance with the principles disclosed previously herein. VC1 and VC2 may be used to set, for example, the gate bias voltages $VG_{M1}$ and $VG_{M3}$ as labeled in FIG. 2, or the bulk bias voltages $VB_{M1}$ and $VB_{M3}$ as labeled in FIG. 3.

Referring to FIG. 5, at step 500, the calibration mechanism of FIG. 4 may be instructed to receive on a channel near the center of the frequency band of interest, such as 869-894 MHz corresponding to the cellular band, or 1930-1990 MHz corresponding to the personal communications service (PCS) band. This can be done by setting the frequency of the LO (not shown in FIG. 4) to the frequency of the desired channel. The control signals VC1 and VC2 are both initially set to the minimum values within their respective ranges. At step 502, a signal with two frequency tones, f1 and f2, is supplied to the input of the LNA as input voltage Vs. In an embodiment, the tones f1 and f2 lie outside the channel of interest. In an embodiment of a direct conversion receiver for the W-CDMA standard, f1 and f2 differ by 200 kHz, such that their IM2 product lies within a baseband channel having a 1.92 MHz bandwidth.

In the presence of second-order distortion in the mixer, the output of the mixer will contain a tone at the difference frequency |f1−f2|. At step 504, the baseband 408 measures the power $P_{|f1-f2|}$ of the tone present at the difference frequency |f1−f2|, and supplies the value of $P_{|f1-f2|}$ to the DSP. At step 506, the DSP records the value of $P_{|f1-f2|}$ with the associated value of VC1. At step 508, the DSP determines whether the value of VC1 has been increased to the maximum value within its range. If not, then the DSP increments VC1 by a step size at step 510, and returns to step 504. If VC1 has reached the maximum allowed value of VC1, then DSP proceeds to step 512. At step 512, the DSP analyzes the recorded values of $P_{|f1-f2|}$ for all swept values of VC1, and determines the value of VC1 associated with the lowest measured $P_{|f1-f2|}$. This value of VC1 may be referred to as $VC1_{best}$. Also in step 512, the value of VC1 may be set at $VC1_{best}$ for the remaining steps of FIG. 5.

Figure 5A:
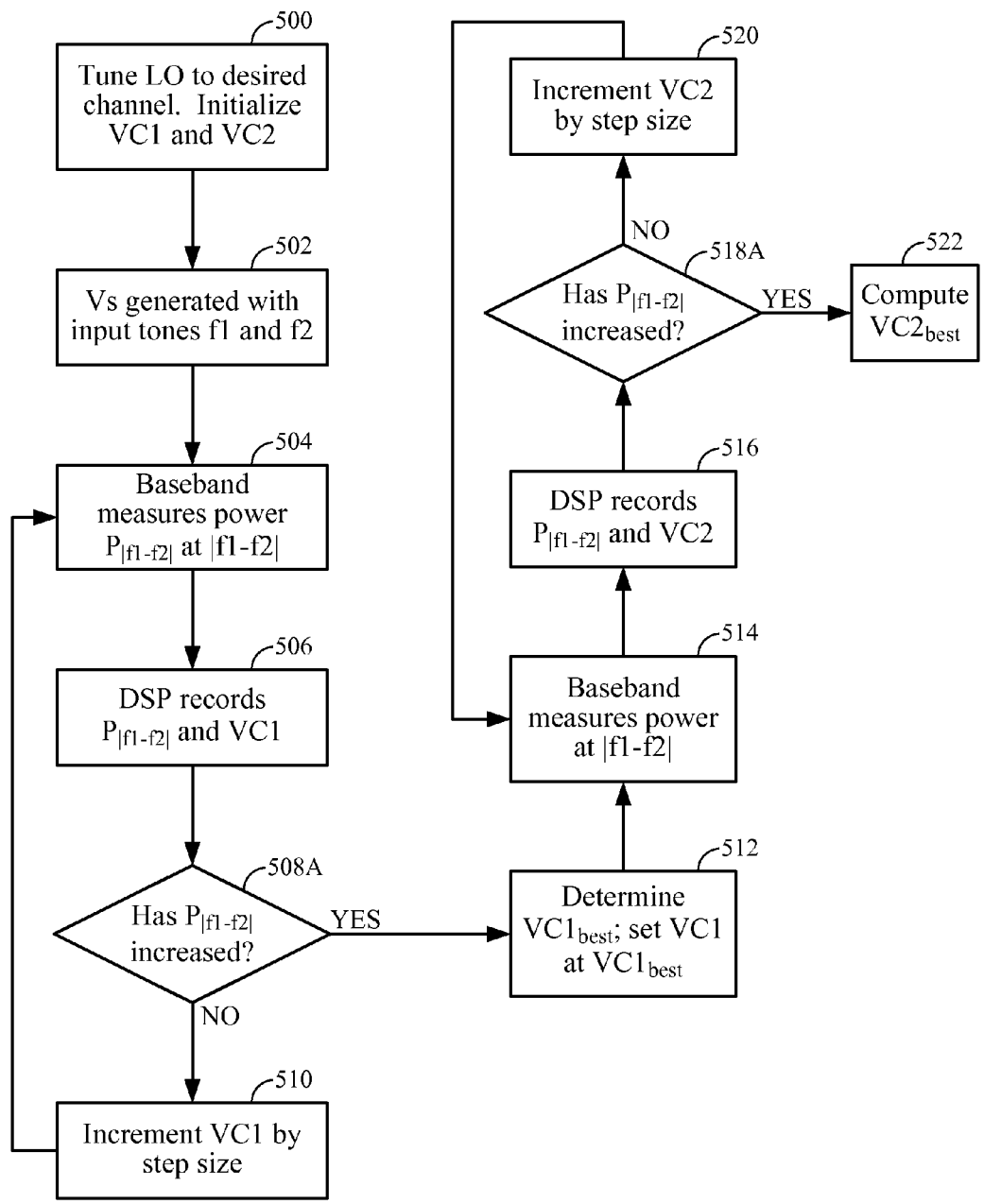
FIG. 5A depicts an alternative embodiment of a method for calibrating a configurable mixer of the present disclosure employing a potentially abbreviated number of steps compared to FIG. 5.
Figure 5B:
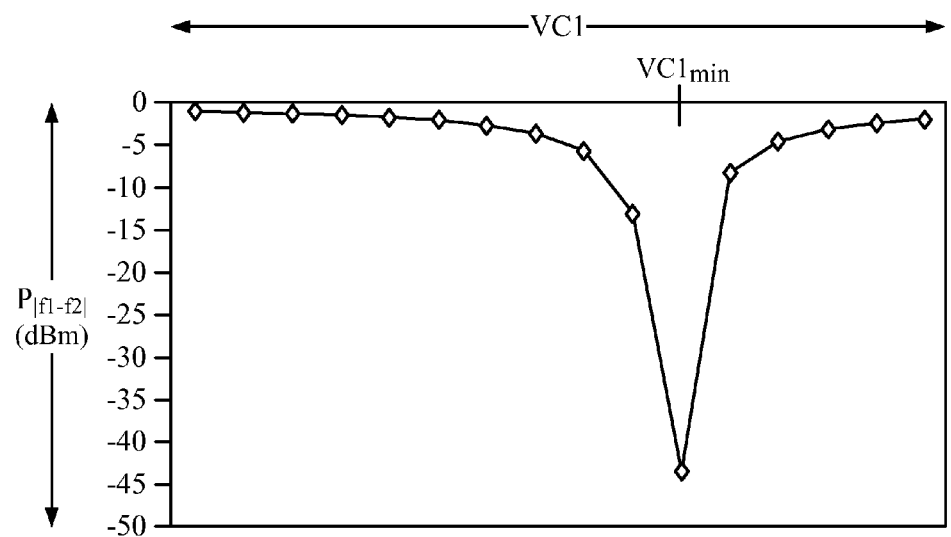
FIG. 5B depicts a hypothetical $P_{|f1-f2|}$ vs. VC1 relationship to illustrate the parameters cited above.

FIG. 5B depicts a hypothetical $P_{|f1-f2|}$ vs. VC1 relationship to illustrate the parameters cited above. Note FIG. 5B is provided for illustrative purposes only, and is not meant to limit the disclosed techniques to devices or parameters having any particular transfer characteristics.

Note the method of FIG. 5 may be designed to optimize for parameters other than or in addition to IM2 by simply replacing the checking for minimum $P_{|f1-f2|}$ with checking for a desired characteristic or characteristics of some other parameter or parameters.

Returning to FIG. 5, VC2 is next swept over a predetermined range while VC1 is held constant at $VC1_{best}$. In particular, step 514 initially commences with VC2 set to the minimum value within its allowable range. At step 514, the baseband again measures the power present at the difference frequency, and supplies the measured power value $P_{|f1-f2|}$ to the DSP. At step 516, the DSP records the measured $P_{|f1-f2|}$ with the associated value of VC2. At step 518, the DSP determines whether the value of VC2 has been increased to the maximum within its range. If not, the DSP increments VC2 at step 520 and returns to step 514. If VC2 has reached the maximum allowed value of VC2, then the DSP proceeds to step 522. At step 522, the DSP analyzes the recorded values of $P_{|f1-f2|}$ for all swept values of VC2, and determines the value of VC2 associated with the lowest measured $P_{|f1-f2|}$. This value of VC2 may be referred to as $VC2_{best}$. Once $VC2_{best}$ is determined, the radio may exit calibration mode, and commence (or resume) normal operation. In an embodiment, during normal operation, the control signals $VC1_{best}$ and $VC2_{best}$ may be continuously supplied to the DAC to configure the bias voltages of the mixer as previously described herein.

In an embodiment, VC1 and VC2 can each be incremented by a step size equal to the minimum resolution of the DAC during calibration. For example, in an embodiment wherein bits <5:0> of the DAC register specify the signed magnitude of VC1, the step size can be the voltage difference associated with the least-significant bit of bits <5:0>.

In an alternative embodiment, to speed up calibration, the step size may be larger than the minimum resolution of the DAC. In this embodiment, the setting for $VC1_{best}$ corresponding to the lowest IM2 product for the mixer may not be present in the recorded values of VC1 vs. $P_{|f1-f2|}$, as the best setting may have been "skipped" due to the larger step size. In this case, $VC1_{best}$ may be determined by averaging the two values of VC1 corresponding to the lowest and second-lowest values of $P_{|f1-f2|}$. Alternatively, a predetermined offset may be added to the determined $VC1_{best}$ to derive the actual control input supplied to the mixer.

FIG. 5A depicts an alternative embodiment of a method for calibrating a configurable mixer of the present disclosure employing a potentially abbreviated number of steps compared to FIG. 5. Steps in FIG. 5A correspond to similarly labeled steps in FIG. 5, with noted differences in steps 508A and 518A. In the embodiment of FIG. 5A, rather than checking for whether the value of VC1 has been increased to a maximum at a step 508, the method at a step 508A checks whether the currently measured value of $P_{|f1-f2|}$ is more than the previously measured value of $P_{|f1-f2|}$. If so, the method advances to the calibration of VC2, without sweeping through the remaining values of VC1. The value of VC1 corresponding to the $P_{|f1-f2|}$ measured prior to the detected increase can be taken as $VC1_{best}$. A similar check can be performed for VC2 at step 518A. This embodiment effectively treats the local minimum for the measured $P_{|f1-f2|}$ as the global minimum. This may speed up the calibration, as the desired values for VC1 and VC2 may be determined without sweeping through the entire range of either parameter.

Note the methods depicted in FIGS. 5 and 5A can be readily applied to calibrate mixers having more or less than two configurable degrees of freedom by, for example, providing more or fewer steps than are shown. For example, in an embodiment, wherein only one control signal VC1 is used to configure a mixer, the method of FIG. 5 may be terminated after step 512. In another embodiment, four control signals VC1-VC4 may be determined by adding steps beyond 522 for determining VC3 and VC4, while holding the previously optimized degrees of freedom constant at their determined optimum values.

Note the calibration described in FIGS. 5 and 5A may be performed whenever the signal input Vs is known. In an embodiment, calibration can be done at the factory, when a chip is tested prior to shipping. In an embodiment, calibration can be done during normal operation as follows. Where full duplexing is supported (i.e., simultaneous transmission and reception by a single radio), TX 450 may transmit Vs, which is coupled to RX 451 through the residual coupling of the duplexer 402. Note TX 450 may transmit Vs at a suitably high power level to overcome attenuation between the transmit path and receive path introduced by, for example, the duplexer 402 and/or TX/RX filters (not shown).

Figure 6:
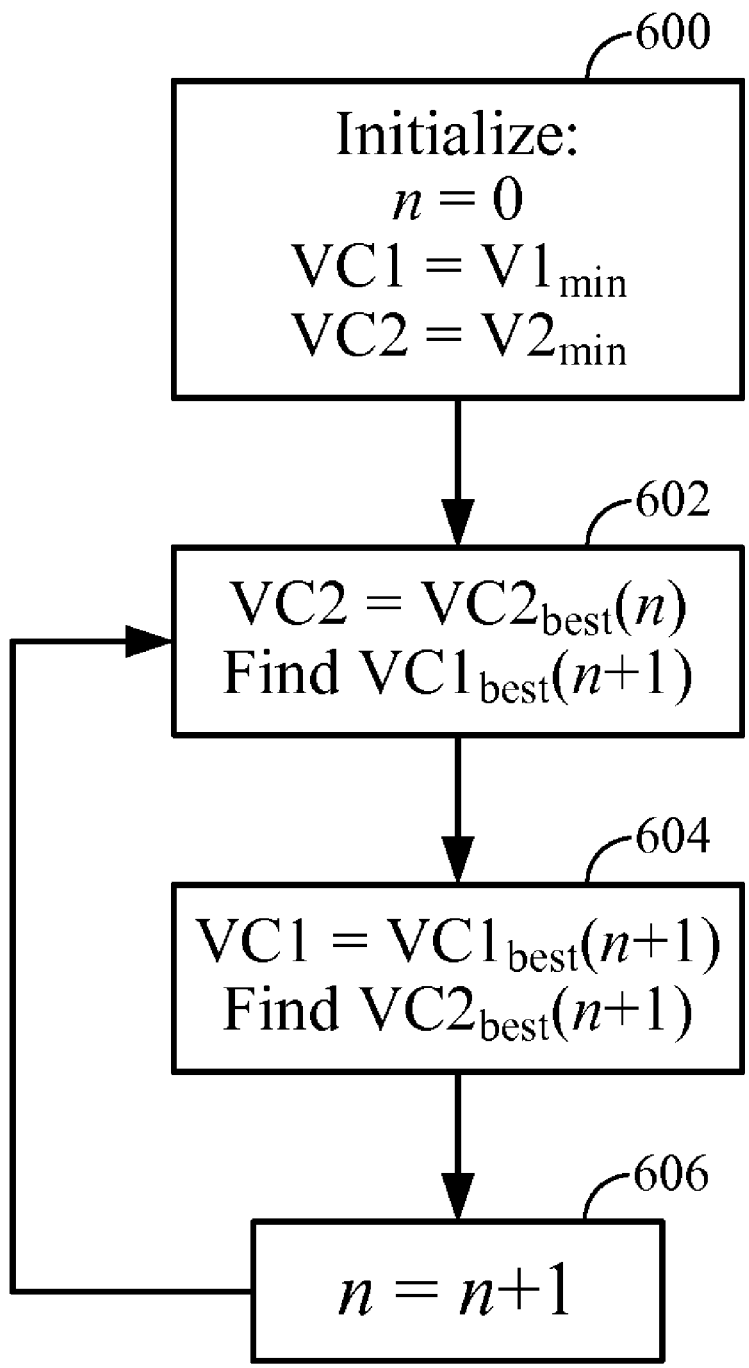
FIG. 6 depicts one embodiment of a method that successively iterates an arbitrary number of times n to determine optimum control signals $VC1_{best}(n)$ and $VC2_{best}(n)$.

In an embodiment, steps in addition to those shown in FIG. 5 may be provided to further optimize IM2 for the mixer. FIG. 6 depicts one embodiment of a method that successively iterates an arbitrary number of times n to determine optimum control signals $VC1_{best}(n)$ and $VC2_{best}(n)$. At step 600, n is initialized to zero, and VC1 and VC2 may be initialized to the minimum voltages in their respective ranges $VC1_{min}$ and $VC2_{min}$. At step 602, VC2 is held constant, while VC1 is swept over its range to locate a best setting $VC1_{best}(1)$. In an embodiment, the sweep can be done according to the method shown in either FIG. 5 or 5A. In other embodiments, other methods for determining $VC1_{best}$ may be applied. At step 604, VC1 is held constant at $VC1_{best}(1)$, and VC2 is swept over its range to locate a best setting $VC2_{best}(1)$. At step 606, n is iterated by 1 to n=1, and steps 602-604 may be repeated (i.e., looped).

Note the method shown in FIG. 6 may generally be terminated at any arbitrary point in the loop. In an embodiment, the method is terminated when n reaches 1, i.e., only one iteration of the loop is run. In another embodiment, the method is terminated after step 702 with n=1, i.e., one-and-a-half iterations of the loop are run. In another embodiment, the method is terminated when the measured value of $P_{|f1-f2|}$ for a newly determined $VC1_{best}(n)$ or $VC2_{best}(n)$ differs from the measured value of $P_{|f1-f2|}$ for a previous $VC1_{best}(n-1)$ or $VC2_{best}(n-1)$, respectively, by an amount less than a predetermined threshold.

Note the method depicted in FIG. 6 can be readily applied to calibrate mixers having more than two configurable degrees of freedom by, for example, adding additional steps within the loop shown.

Figure 7:
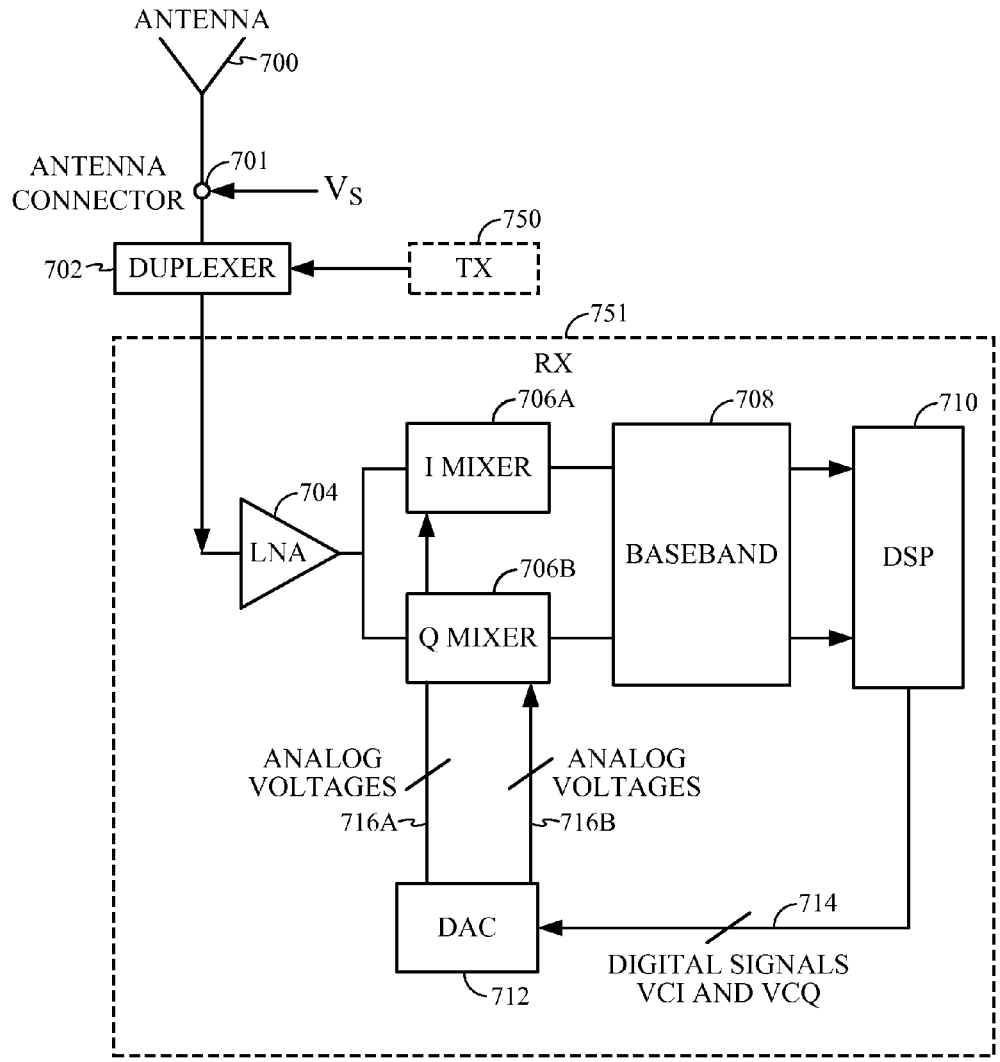
FIG. 7 depicts an embodiment of a calibration mechanism for a radio having two mixers, e.g., a mixer for the in-phase (I) path and a mixer for the quadrature-phase (Q) path.

FIG. 7 depicts an embodiment of a calibration mechanism for a radio having two mixers, e.g., a mixer for the in-phase (I) path and a mixer for the quadrature-phase (Q) path. FIG. 7 shows an antenna 700 coupled to a duplexer 702 via antenna connector 701. The LNA 704 output is provided to both an I mixer 706A and a Q mixer 706B. Each mixer can be made configurable according to the embodiments disclosed herein. The outputs of the mixers 706A and 706B are provided to the baseband 708, and the baseband 708 provides signals to the DSP 710. The DSP 710 generates digital signals VCI and VCQ 714. VCI may comprise one or more control signals to configure the I mixer 706A according to the present disclosure, and VCQ may likewise comprise one or more control signals to configure the Q mixer 706B. Digital signals 714 are supplied to the DAC 712, which converts the digital signals 714 to two sets of analog voltages 716A and 716B. Analog voltages 716A are used to configure the I mixer 706A, while analog voltages 716B are used to configure the I mixer 706B according to the techniques previously disclosed herein.

Figure 8:
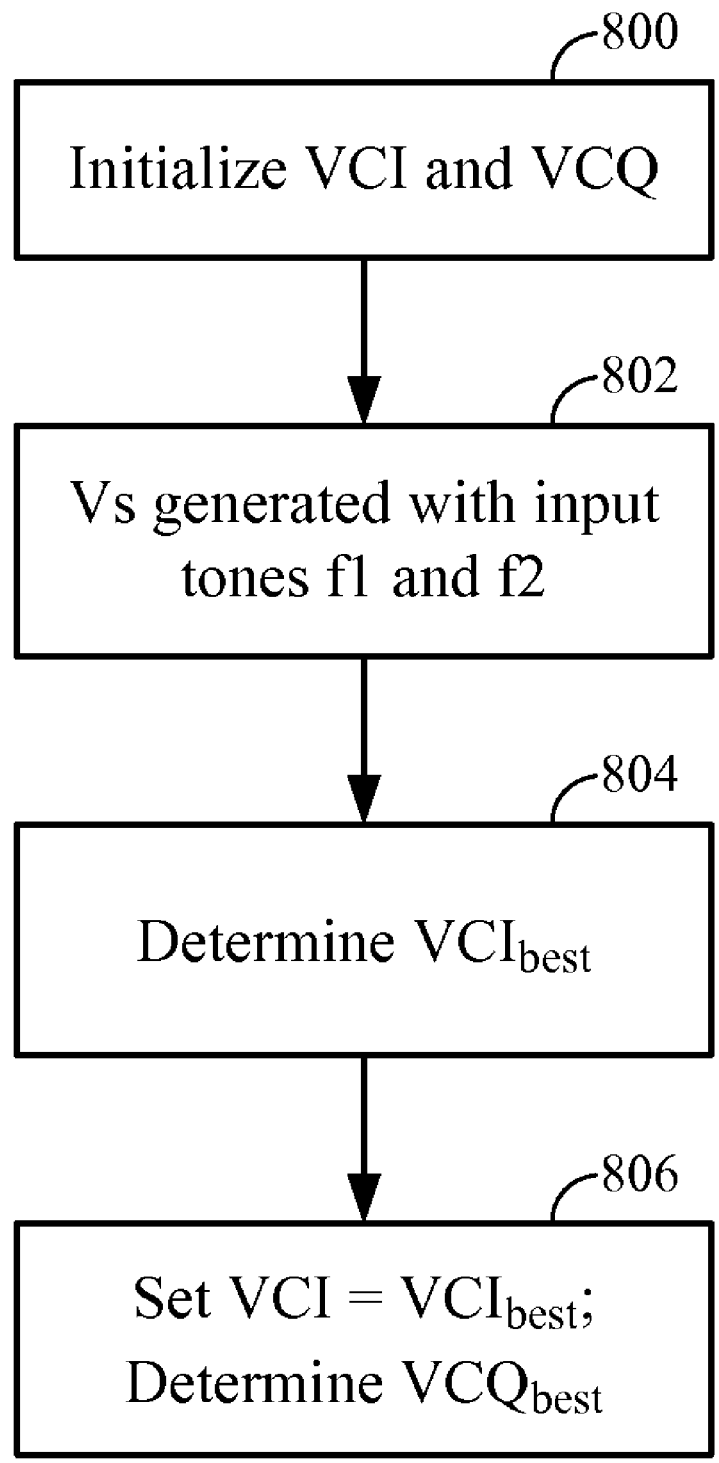
FIG. 8 depicts an embodiment of a method for calibrating the I/Q mixers shown in FIG. 7.

FIG. 8 depicts an embodiment of a method for calibrating the I/Q mixers shown in FIG. 7. At step 800, VCI and VCQ are initialized. At step 802, an input signal Vs containing two tones is supplied to the LNA 704 in FIG. 7. At step 804, best control signal or signals $VCI_{best}$ are determined for the I mixer 706A. Step 804 may utilize a method previously disclosed herein, or any other method, for deriving $VCI_{best}$. At step 806, best control signal or signals $VCQ_{best}$ are determined for the Q mixer 706B, while VCI is held at $VCI_{best}$.

In an embodiment, the method of FIG. 8 may be further augmented by having step 806 loop back to step 804, and determining a new value for $VCI_{best}$ while holding VCQ fixed at $VCQ_{best}$. This may be done an arbitrary number of times to obtain an optimal configuration for the control signals.

Note the techniques of the present disclosure need not be limited to passive mixers. Active mixers such as those employing Gilbert multipliers may also employ the techniques disclosed. The appropriate modifications will be clear to those of ordinary skill in the art, and are contemplated to be within the scope of the present disclosure.

Based on the teachings described herein, it should be apparent that an aspect disclosed herein may be implemented independently of any other aspects and that two or more of these aspects may be combined in various ways. The techniques described herein may be implemented in hardware, software, firmware, or any combination thereof. If implemented in hardware, the techniques may be realized using digital hardware, analog hardware or a combination thereof. If implemented in software, the techniques may be realized at least in part by a computer-program product that includes a computer readable medium on which one or more instructions or code is stored.

By way of example, and not limitation, such computer-readable media can comprise RAM, such as synchronous dynamic random access memory (SDRAM), read-only memory (ROM), non-volatile random access memory (NVRAM), ROM, electrically erasable programmable read-only memory (EEPROM), erasable programmable read-only memory (EPROM), FLASH memory, CD-ROM or other optical disk storage, magnetic disk storage or other magnetic storage devices, or any other tangible medium that can be used to carry or store desired program code in the form of instructions or data structures and that can be accessed by a computer.

The instructions or code associated with a computer-readable medium of the computer program product may be executed by a computer, e.g., by one or more processors, such as one or more digital signal processors (DSPs), general purpose microprocessors, ASICs, FPGAs, or other equivalent integrated or discrete logic circuitry.

A number of aspects and examples have been described. However, various modifications to these examples are possible, and the principles presented herein may be applied to other aspects as well. These and other aspects are within the scope of the following claims.

The invention claimed is:

1. A method for calibrating a mixer, the method comprising:
   (a) setting a calibration mechanism to receive on a channel near a center of a frequency band of interest;
   (b) setting a first control signal to a first minimum range value;
   (c) setting a second control signal to a second minimum range value;
   (d) receiving an input signal comprising two frequency tones;
   (e) measuring a first absolute power value of a tone present at a frequency difference between the two frequency tones of the input signal;
   (f) associating the measured first absolute power value with the first control signal value;
   (g) storing the measured first absolute power value associated with the first control signal value in memory;
   (h) determining if the first control signal equals a first maximum value;
   (i) incrementing the first control signal by its steps size if the first control signal does not equal the first maximum value and repeating steps (e) through (h);
   (j) determining which of the measured first absolute power values stored in memory possesses a first characteristic, if the first control signal equals the first maximum value;
   (k) identifying the first control signal value associated with the determined measured first absolute power value stored in memory possessing the first characteristic as a best first control signal value;
   (l) setting the first control signal value to the best first control signal value;
   (m) measuring a second absolute power value of a tone present at the frequency difference between the two frequency tones of the input signal;
   (n) associating the measured second power value with the second control signal value;
   (o) storing the measured second absolute power value associated with the second control signal value in memory;
   (p) determining if the second control signal equals a second maximum value;
   (q) incrementing the second control signal by its steps size if the second control signal does not equal the second maximum value and repeating steps (m) through (p);
   (r) determining which of the measured second absolute power values stored in memory possesses a second characteristic, if the second control signal equals the second maximum value;
   (s) identifying the second control signal value associated with the determined measured second absolute power value stored in memory possessing the second characteristic as a best second control signal value; and
   (t) setting the second control signal value to the best second control signal value.

2. The method of claim 1, wherein the step size is equal to a minimum resolution of a digital-to-analog converter in the calibration mechanism.

3. The method of claim 1, wherein the first characteristic is the measured first absolute power values stored in memory having a lowest first absolute value and the second characteristic is the measured second absolute power values stored in memory having a lowest second absolute value.

4. The method of claim 1, wherein the first and second control signals are first mixer transistor and second mixer transistor gate bias voltages.

5. The method of claim 1, wherein the first and second control signals are first mixer transistor and second mixer transistor bulk bias voltages.

6. The method of claim 1, further comprising:
(u) setting a counter value to zero;
(v) performing steps (a) to (t); and
(x) incrementing the counter value and iterating steps (v) and (x).

7. The method of claim 6, further comprising terminating further steps once the counter value reaches a predetermined value.

8. The method of claim 6, further comprising:
determining a difference between the second absolute power values for subsequent iterations; and
terminating further iterations if the determined difference is below a predetermined threshold.

9. A method for calibrating a mixer, the method comprising:
(a) setting a calibration mechanism to receive on a channel near a center of a frequency band of interest;
(b) setting a first control signal to a first minimum range value;
(c) setting a second control signal to a second minimum range value;
(d) receiving an input signal comprising two frequency tones;
(e) measuring a first absolute power value of a tone present at a frequency difference between the two frequency tones of the input signal;
(f) associating the measured first absolute power value with the first control signal value;
(g) storing the measured first absolute power value associated with the first control signal value in memory;
(h) determining if the measured first absolute power value has increased;
(i) incrementing the first control signal by its steps size if the first absolute power value has not increased and repeating steps (e) through (h);
(j) determining which of the measured first absolute power values stored in memory possesses a first characteristic, if the first absolute power value has increased;
(k) identifying the first control signal value associated with the determined measured first absolute power value stored in memory possessing the first characteristic as a best first control signal value;
(l) setting the first control signal value to the best first control signal value;
(m) measuring a second absolute power value of a tone present at the frequency difference between the two frequency tones of the input signal;
(n) associating the measured second power value with the second control signal value;
(o) storing the measured second absolute power value associated with the second control signal value in memory;
(p) determining if the second absolute power value has increased;
(q) incrementing the second control signal by its steps size if the second absolute power value has not increased and repeating steps (m) through (p);
(r) determining which of the measured second absolute power values stored in memory possesses a second characteristic, if the second absolute power value has increased;
(s) identifying the second control signal value associated with the determined measured second absolute power value stored in memory possessing the second characteristic as a best second control signal value;
(t) setting the second control signal value to the best second control signal value.

10. The method of claim 9, wherein the step size is equal to a minimum resolution of a digital-to-analog converter in the calibration mechanism.

11. The method of claim 9, wherein the first characteristic is the measured first absolute power values stored in memory having a lowest first absolute value and the second characteristic is the measured second absolute power values stored in memory having a lowest second absolute value.

12. The method of claim 9, wherein the first and second control signals are first mixer transistor and second mixer transistor gate bias voltages.

13. The method of claim 9, wherein the first and second control signals are first mixer transistor and second mixer transistor bulk bias voltages.

14. The method of claim 9, further comprising:
(u) setting a counter value to zero;
(v) performing steps (a) to (t); and
(x) incrementing the counter value and iterating steps (v) and (x).

15. The method of claim 14, further comprising terminating further steps once the counter value reaches a predetermined value.

16. The method of claim 14, further comprising:
determining a difference in between the second absolute power values for subsequent iterations; and
terminating further iterations if the determined difference is below a predetermined threshold.

17. A calibration mechanism, comprising:
means for setting the calibration mechanism to receive on a channel near a center of a frequency band of interest;
means for setting a first control signal to a first minimum range value;
means for setting a second control signal to a second minimum range value;
means for receiving an input signal comprising two frequency tones;
means for measuring a first absolute power value of a tone present at a frequency difference between the two frequency tones of the input signal;
means for associating the measured first absolute power value with the first control signal value;
means for storing the measured first absolute power value associated with the first control signal value in memory;
means for determining if the first control signal equals a first maximum value;
means for incrementing the first control signal by its steps size if the first control signal does not equal the first maximum value;
means for determining which of the measured first absolute power values stored in memory possesses a first characteristic, if the first control signal equals the first maximum value;

means for identifying the first control signal value associated with the determined measured first absolute power value stored in memory meeting the first criteria as a best first control signal value;

means for setting the first control signal value to the best first control signal value;

means for measuring a second absolute power value of a tone present at the frequency difference between the two frequency tones of the input signal;

means for associating the measured second power value with the second control signal value;

means for storing the measured second absolute power value associated with the second control signal value in memory;

means for determining if the second control signal equals a second maximum value;

means for incrementing the second control signal by its steps size if the second control signal does not equal the second maximum value;

means for determining which of the measured second absolute power values stored in memory possesses a second characteristic, if the second control signal equals the second maximum value;

means for identifying the second control signal value associated with the determined measured second absolute power value stored in memory possessing the second characteristic as a best second control signal value; and means for setting the second control signal value to the best second control signal value.

18. The calibration mechanism of claim 17, further comprising a digital-to-analog convertor, wherein the step size is equal to a minimum resolution of the digital-to-analog converter.

19. The calibration mechanism of claim 17, wherein the first characteristic is the measured first absolute power values stored in memory having a lowest first absolute value and the second characteristic is the measured second absolute power values stored in memory having a lowest second absolute value.

20. The calibration mechanism of claim 17, further comprising a mixer comprising at least a first transistor and a second transistor, wherein the first and second control signals are first mixer transistor and second mixer transistor gate bias voltages.

21. The calibration mechanism of claim 17, further comprising a mixer comprising at least a first transistor and a second transistor, wherein the first and second control signals are first mixer transistor and second mixer transistor bulk bias voltages.

22. The calibration mechanism of claim 17, further comprising:

an iteration counter;

means for setting the iteration counter value to zero; and means for incrementing the iteration counter value.

23. The calibration mechanism of claim 22, further comprising means for terminating further steps once the iteration counter value reaches a predetermined value.

24. The calibration mechanism of claim 22, further comprising:

means for determining a difference in between the second absolute power values for subsequent iterations; and means for terminating further iterations if the determined difference is below a predetermined threshold.

25. A calibration mechanism, comprising:

means for setting the calibration mechanism to receive on a channel near a center of a frequency band of interest;

means for setting a first control signal to a first minimum range value;

means for setting a second control signal to a second minimum range value;

means for receiving an input signal comprising two frequency tones;

means for measuring a first absolute power value of a tone present at a frequency difference between the two frequency tones of the input signal;

means for associating the measured first absolute power value with the first control signal value;

means for storing the measured first absolute power value associated with the first control signal value in memory;

means for determining if the measured first absolute power value has increased;

means for incrementing the first control signal by its steps size if the first absolute power value has not increased;

means for determining which of the measured first absolute power values stored in memory possesses a first characteristic, if the first absolute power value has increased;

means for identifying the first control signal value associated with the determined measured first absolute power value stored in memory possesses the first characteristic as a best first control signal value;

means for setting the first control signal value to the best first control signal value;

means for measuring a second absolute power value of a tone present at the frequency difference between the two frequency tones of the input signal;

means for associating the measured second power value with the second control signal value;

means for storing the measured second absolute power value associated with the second control signal value in memory;

means for determining if the second absolute power value has increased;

means for incrementing the second control signal by its steps size if the second absolute power value has not increased;

means for determining which of the measured second absolute power values stored in memory possesses a second characteristic, if the second absolute power value has increased;

means for identifying the second control signal value associated with the determined measured second absolute power value stored in memory possessing the second characteristic as a best second control signal value; and means for setting the second control signal value to the best second control signal value.

26. The calibration mechanism of claim 25, further comprising a digital-to-analog convertor, wherein the step size is equal to a minimum resolution of the digital-to-analog converter.

27. The calibration mechanism of claim 25, wherein the first characteristic is the measured first absolute power values stored in memory having a lowest first absolute value and the second characteristic is the measured second absolute power values stored in memory having a lowest second absolute value.

28. The calibration mechanism of claim 25, further comprising a mixer comprising at least a first transistor and a second transistor, wherein the first and second control signals are first mixer transistor and second mixer transistor gate bias voltages.

29. The calibration mechanism of claim 25, further comprising a mixer comprising at least a first transistor and a second transistor, wherein the first and second control signals are first mixer transistor and second mixer transistor bulk bias voltages.

30. The calibration mechanism of claim 25, further comprising:
an iteration counter;
means for setting the iteration counter value to zero; and
means for incrementing the iteration counter value.

31. The calibration mechanism of claim 30, further comprising means for terminating further steps once the iteration counter value reaches a predetermined value.

32. The calibration mechanism of claim 30, further comprising:
means for determining a difference in between the second absolute power values for subsequent iterations; and
means for terminating further iterations if the determined difference is below a predetermined threshold.

33. A non-transitory processor-readable storage medium having stored thereon software instructions configured to cause a processor to perform steps comprising:
(a) setting a calibration mechanism to receive on a channel near a center of a frequency band of interest;
(b) setting a first control signal to a first minimum range value;
(c) setting a second control signal to a second minimum range value;
(d) receiving an input signal comprising two frequency tones;
(e) measuring a first absolute power value of a tone present at a frequency difference between the two frequency tones of the input signal;
(f) associating the measured first absolute power value with the first control signal value;
(g) storing the measured first absolute power value associated with the first control signal value in memory;
(h) determining if the first control signal equals a first maximum value;
(i) incrementing the first control signal by its steps size if the first control signal does not equal the first maximum value and repeating steps (e) through (h);
(j) determining which of the measured first absolute power values stored in memory possesses a first characteristic, if the first control signal equals the first maximum value;
(k) identifying the first control signal value associated with the determined measured first absolute power value stored in memory possessing the first characteristic as a best first control signal value;
(l) setting the first control signal value to the best first control signal value;
(m) measuring a second absolute power value of a tone present at the frequency difference between the two frequency tones of the input signal;
(n) associating the measured second power value with the second control signal value;
(o) storing the measured second absolute power value associated with the second control signal value in memory;
(p) determining if the second control signal equals a second maximum value;
(q) incrementing the second control signal by its steps size if the second control signal does not equal the second maximum value and repeating steps (m) through (p);
(r) determining which of the measured second absolute power values stored in memory possesses a second characteristic, if the second control signal equals the second maximum value;
(s) identifying the second control signal value associated with the determined measured second absolute power value stored in memory possessing the second characteristic as a best second control signal value; and
(t) setting the second control signal value to the best second control signal value.

34. The non-transitory processor-readable storage medium of claim 33, wherein the step size is equal to a minimum resolution of a digital-to-analog converter in the calibration mechanism.

35. The non-transitory processor-readable storage medium of claim 33, wherein the first characteristic is the measured first absolute power values stored in memory having a lowest first absolute value and the second characteristic is the measured second absolute power values stored in memory having a lowest second absolute value.

36. The non-transitory processor-readable storage medium of claim 33, wherein the first and second control signals are first mixer transistor and second mixer transistor gate bias voltages.

37. The non-transitory processor-readable storage medium of claim 33, wherein the first and second control signals are first mixer transistor and second mixer transistor bulk bias voltages.

38. The non-transitory processor-readable storage medium of claim 33, wherein the stored software instructions are configured to cause the processor to perform steps further comprising:
(u) setting a counter value to zero;
(v) performing steps (a) to (t); and
(x) incrementing the counter value and iterating steps (v) and (x).

39. The non-transitory processor-readable storage medium of claim 38, wherein the stored software instructions are configured to cause the processor to perform steps further comprising:
terminating further steps once the counter value reaches a predetermined value.

40. The non-transitory processor-readable storage medium of claim 38, wherein the stored software instructions are configured to cause the processor to perform steps further comprising:
determining a difference in between the second absolute power values for subsequent iterations; and
terminating further iterations if the determined difference is below a predetermined threshold.

41. A non-transitory processor-readable storage medium having stored thereon software instructions configured to cause a processor to perform steps comprising:
(a) setting a calibration mechanism to receive on a channel near a center of a frequency band of interest;
(b) setting a first control signal to a first minimum range value;
(c) setting a second control signal to a second minimum range value;
(d) receiving an input signal comprising two frequency tones;
(e) measuring a first absolute power value of a tone present at a frequency difference between the two frequency tones of the input signal;
(f) associating the measured first absolute power value with the first control signal value;
(g) storing the measured first absolute power value associated with the first control signal value in memory;
(h) determining if the measured first absolute power value has increased;
(i) incrementing the first control signal by its steps size if the first absolute power value has not increased and repeating steps (e) through (h);

(j) determining which of the measured first absolute power values stored in memory possess a first characteristic, if the first absolute power value has increased;

(k) identifying the first control signal value associated with the determined measured first absolute power value stored in memory possessing the first characteristic as a best first control signal value;

(l) setting the first control signal value to the best first control signal value;

(m) measuring a second absolute power value of a tone present at the frequency difference between the two frequency tones of the input signal;

(n) associating the measured second power value with the second control signal value;

(o) storing the measured second absolute power value associated with the second control signal value in memory;

(p) determining if the second absolute power value has increased;

(q) incrementing the second control signal by its steps size if the second absolute power value has not increased and repeating steps (m) through (p);

(r) determining which of the measured second absolute power values stored in memory possesses a second characteristic, if the second absolute power value has increased;

(s) identifying the second control signal value associated with the determined measured second absolute power value stored in memory possessing the second characteristic as a best second control signal value; and (t) setting the second control signal value to the best second control signal value.

42. The non-transitory processor-readable storage medium of claim 41, wherein the step size is equal to a minimum resolution of a digital-to-analog converter in the calibration mechanism.

43. The non-transitory processor-readable storage medium of claim 41, wherein the first characteristic is the measured first absolute power values stored in memory having a lowest first absolute value and the second characteristic is the measured second absolute power values stored in memory having a lowest second absolute value.

44. The non-transitory processor-readable storage medium of claim 41, wherein the first and second control signals are first mixer transistor and second mixer transistor gate bias voltages.

45. The non-transitory processor-readable storage medium of claim 41, wherein the first and second control signals are first mixer transistor and second mixer transistor bulk bias voltages.

46. The non-transitory processor-readable storage medium of claim 41, wherein the stored software instructions are configured to cause the processor to perform steps further comprising:

(u) setting a counter value to zero;
(v) performing steps (a) to (t); and
(x) incrementing the counter value and iterating steps (v) and (x).

47. The non-transitory processor-readable storage medium of claim 46, wherein the stored software instructions are configured to cause the processor to perform steps further comprising:

terminating further steps once the counter value reaches a predetermined value.

48. The non-transitory processor-readable storage medium of claim 46, wherein the stored software instructions are configured to cause the processor to perform steps further comprising:

determining a difference in between the second absolute power values for subsequent iterations; and
terminating further iterations if the determined difference is below a predetermined threshold.

* * * * *